US010423345B2

(12) United States Patent
d'Abreu

(10) Patent No.: US 10,423,345 B2
(45) Date of Patent: Sep. 24, 2019

(54) DEVICES, SYSTEMS, AND METHODS FOR INCREASING ENDURANCE ON A STORAGE SYSTEM HAVING A PLURALITY OF COMPONENTS USING ADAPTIVE CODE-RATES

(71) Applicant: Smart IOPS, Inc., Milpitas, CA (US)

(72) Inventor: Manuel Antonio d'Abreu, El Dorado Hills, CA (US)

(73) Assignee: SMART IOPS, INC., Milpitas, CA (US)

( * ) Notice: Subject to any disclaimer, the term of this patent is extended or adjusted under 35 U.S.C. 154(b) by 107 days.

(21) Appl. No.: 15/732,039

(22) Filed: Sep. 6, 2017

(65) Prior Publication Data

US 2018/0067666 A1  Mar. 8, 2018

Related U.S. Application Data

(60) Provisional application No. 62/383,959, filed on Sep. 6, 2016.

(51) Int. Cl.
| | |
|---|---|
| G06F 11/00 | (2006.01) |
| G06F 3/06 | (2006.01) |
| G11C 29/52 | (2006.01) |
| G06F 11/07 | (2006.01) |
| G06F 11/10 | (2006.01) |
| G06F 11/08 | (2006.01) |
| G11C 29/04 | (2006.01) |
| G11C 29/44 | (2006.01) |

(52) U.S. Cl.
CPC ........ *G06F 3/0619* (2013.01); *G06F 11/0703* (2013.01); *G06F 11/08* (2013.01); *G06F 11/1044* (2013.01); *G06F 11/1056* (2013.01); *G11C 29/52* (2013.01); *G11C 2029/0401* (2013.01); *G11C 2029/0409* (2013.01); *G11C 2029/0411* (2013.01); *G11C 2029/4402* (2013.01)

(58) Field of Classification Search
None
See application file for complete search history.

(56) References Cited

U.S. PATENT DOCUMENTS

| | | | | |
|---|---|---|---|---|
| 4,209,846 A | * | 6/1980 | Seppa | G06F 11/073 |
| | | | | 714/52 |
| 7,386,767 B1 | * | 6/2008 | Xue | G06F 11/076 |
| | | | | 714/48 |
| 2010/0122148 A1 | * | 5/2010 | Flynn | G06F 11/108 |
| | | | | 714/773 |

(Continued)

*Primary Examiner* — Daniel F. McMahon
(74) *Attorney, Agent, or Firm* — Willink & Hunt LLP; Marcus T. Hunt

(57) ABSTRACT

Devices, systems, and methods are provided that include a controller configured to receive a first data packet from a memory device; determine a bit error count for the first data packet; and determine whether the bit error count exceeds a predetermined threshold. When the bit error count exceeds the predetermined threshold, the controller corrects errors identified in the bit error count; generates and inserts predefined data into the first data packet at a location where errors occurred in the first data packet; and generates and inserts a tag into the first data packet. The tag includes information indicating a size and a location of the predefined data in the first data packet.

20 Claims, 4 Drawing Sheets

(56) References Cited

U.S. PATENT DOCUMENTS

| | | | |
|---|---|---|---|
| 2015/0117107 A1* | 4/2015 | Sun | G11C 16/10 365/185.12 |
| 2015/0293809 A1* | 10/2015 | Liang | G06F 11/073 714/704 |
| 2018/0188984 A1* | 7/2018 | Tai | G06F 12/0253 |

* cited by examiner

DEVICES, SYSTEMS, AND METHODS FOR INCREASING ENDURANCE ON A STORAGE SYSTEM HAVING A PLURALITY OF COMPONENTS USING ADAPTIVE CODE-RATES

CROSS-REFERENCE TO RELATED APPLICATIONS

This application claims benefit under 35 U.S.C. § 119(e) of U.S. Provisional Application No. 62/383,959, filed Sep. 6, 2016, the entirety of which is incorporated herein by reference.

FIELD

The present disclosure relates generally to the field of memory, and, in particular, to maintaining endurance and data integrity as memory degrades.

BACKGROUND

With advances in flash memory technology, device types, and memory fabrication, the failure rate in the stores data increases. This can be attributed to the manufacturing of the memory, latent defects, or defects that grow over time causing the memory to misbehave, and physics of the device that lead to charge loss over time. This can negatively impact the endurance of the memory, the capability to retain data over period of time, and many other erroneous manifestations.

When a cluster of cells (called memory blocks) shows an increase in number of failed bits over time, and the number of failed bits consistently exceeds a specific threshold, this block is typically decommissioned. This will reduce the capacity of the storage system. Under extreme conditions, the loss in capacity, due to decommissioning of failed blocks, can bring down the entire storage system.

SUMMARY

In certain aspects of the present disclosure, a data storage device is provided that includes a memory device and a controller. The memory includes one or more memory dies. The controller is communicatively coupled to the memory device and includes logic to receive a first data packet from the memory device; determine a bit error count for the first data packet; determine whether the bit error count exceeds a predetermined threshold; and when the bit error count is determined to exceed the predetermined threshold: correct errors identified in the bit error count; generate pre-defined data and insert the pre-defined data into the first data packet at a location where errors occurred in the first data packet; and generate a tag and insert the tag into the first data packet. The tag includes information indicating a size and a location of the pre-defined data in the first data packet.

In certain aspects of the present disclosure, a system is provided that includes a data storage device and an accessing device communicatively coupled to the data storage device. The accessing device is configured to issue commands to the data storage device to read data from or write data to the memory device. The data storage device includes a memory device, and a controller communicatively coupled to the memory device. The controller includes logic to receive a first data packet from the memory device; determine a bit error count for the first data packet; determine whether the bit error count exceeds a predetermined threshold; and when the bit error count is determined to exceed the predetermined threshold: correct errors identified in the bit error count; generate pre-defined data and insert the pre-defined data into the first data packet at a location where errors occurred in the first data packet; and generate a tag and insert the tag into the first data packet. The tag includes information indicating a size and a location of the pre-defined data in the first data packet.

In certain aspects of the present disclosure, a method is provided that includes receiving, at a controller, a first data packet from a memory device that is communicatively coupled to the controller; determining, by the controller, a bit error count for the first data packet; determining, by the controller, that the bit error count exceeds a predetermined threshold; and when the bit error count is determined to exceed the predetermined threshold: correcting, by the controller, errors identified in the bit error count; generating, by the controller, pre-defined data and inserting, by the controller, the pre-defined data into the first data packet at a location where errors occurred in the first data packet; and generating, by the controller, a tag and inserting, by the controller, the tag into the first data packet. The tag includes information indicating a size and a location of the pre-defined data in the first data packet.

BRIEF DESCRIPTION OF THE DRAWINGS

For a better understanding of at least an embodiment, reference will be made to the following Detailed Description, which is to be read in conjunction with the accompanying drawings, wherein.

DETAILED DESCRIPTION

Figure 1:
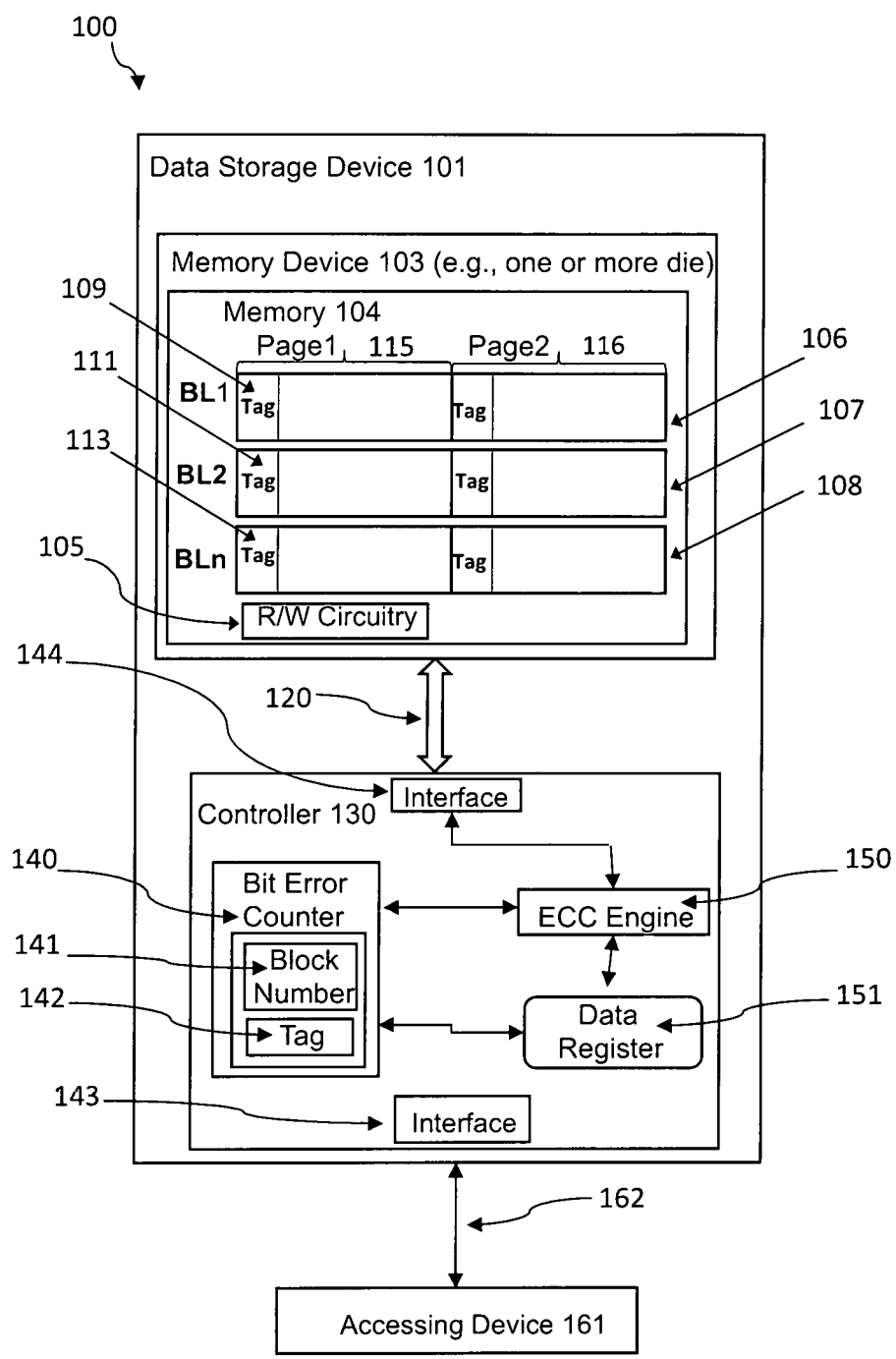
FIG. 1 illustrates a block diagram of an exemplary storage system configured to program a memory according to a programming scheme, according to an embodiment.

Before aspects of the present disclosure are described below with reference to the drawings. In the description, common features may be designated by common reference numbers. Although certain examples are described herein with reference to a data storage system, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more conditions, or events not explicitly recited. As used herein, "exemplary" may indicate an example, an implementation, and/or an aspect, and should not be construed as limiting or as indicating a preference or a preferred example, implementation, and/or aspect.

The present disclosure describes data storage devices, systems, and methods of programming data to, or reading data from a Memory Card, a Storage System, or a set of Memory cards, according to data error tracking on the Memory Card or the storage system. For example, a controller of a data storage device may receive a data packet to be stored at in a number of memory devices. The controller may partition the data word into multiple portions and the multiple portions may be interleaved across multiple memory devices. Also the controller may simultaneously start parallel reads from several memory devices. Additionally, prior to the multiple data packets being stored into, or read from, the Memory Card, or Storage System, a logical address corresponding to the data packets may be mapped to multiple physical addresses that indicate where each of the multiple data packets is to be stored in, or read from, the Memory Card or Storage System. The writing of data and reading of data can be performed simultaneously across several Memory Cards in the storage system.

Due to temperature, time, program cycling of the memory device, incomplete erasure of the memory, programming errors, or other conditions, errors can occur in the stored data. The number of errors in specific wordline, blocks or combination thereof, can increase. This disclosure describes procedure and methods to track such increase in errors and adaptively change the code rate so as to allow the existing errors correction scheme to correct more errors. Thus the integrity of the data remains uncompromised and also the endurance of the system and capability to store data for extended time (data retention) is improved. The subject matter of the present disclosure may be applicable to a wide range of areas, including, but not limited to, storage, networking, communications, computing systems, appliances on the Internet, remotely controlled appliances, and design of reliable systems.

In certain aspects, devices, systems, and methods are provided for increasing endurance on a storage system having a plurality of components using adaptive code rates. The components may include a memory device and a controller coupled to the memory device. The controller may be configured to process data to form codewords and to send the codewords to the memory device to be stored at locations of the memory device. The controller may track the bit error rate, over time, in wordline/blocks. Based on the number of errors and its growth trend, the controller may tag the wordline/blocks for special use and use of adaptive code rate, as described in the techniques disclosed herein.

FIG. 1 illustrates a block diagram of an exemplary storage system configured to program memory based on a programming scheme, according to an embodiment. In FIG. 1, a system 100 is shown including a data storage device 101 and an accessing device 161. The data storage device 101 shown includes a controller 130 (e.g., a memory controller) and a memory device 103 that is coupled to the controller 130 though a connection (or connector scheme) 120. The controller 130 may manage operations related to programming the memory device 103. The memory device 103 may include one or more memory dies. The memory device 103 may include, for example, 2D-Flash, 3D-Flash, ReRAM, MRAM, any other non-volatile or volatile memory technology, or combination thereof.

The data storage device 101 and the accessing device 161 may be coupled via a connection 162 (e.g., a communication path), such as an electrical connection (e.g., bus) or a wireless connection. The data storage device 101 may include an interface 143 (e.g., an accessing device interface) that enables communication via the connection 162 between the data storage device 101 and the accessing device 161.

In an embodiment, the data storage device 101 may be embedded within the accessing device 161, such as in accordance with a Joint Electron Devices Engineering Council (JEDEC) Solid State Technology Association Universal Flash Storage (UFS) configuration. For example, the data storage device 101 may be configured to be coupled to the accessing device 161 as embedded memory, such as eMMC® (trademark of JEDEC Solid State Technology Association, Arlington, Va.) and eSD, as illustrative examples. To illustrate, the data storage device 101 may correspond to an eMMC (embedded MultiMedia Card) device. As another example, the data storage device 101 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 101 may be removable from the accessing device 161 (i.e., "removably" coupled to the accessing device 161). As an example, the data storage device 101 may be coupled to the accessing device 161 in accordance with a removable universal serial bus (USB) configuration or any other protocol, such as PCIE, SATA, or SAS.

In an embodiment, the data storage device 101 may include or correspond to a solid-state drive (SSD), which may be included in, or distinct from (and accessible to), the accessing device 161. For example, the data storage device 101 may include or correspond to an SSD, which may be used as an embedded storage drive (e.g., a mobile embedded storage drive), an enterprise storage drive (ESD), a client storage device, or a cloud storage drive, as illustrative, non-limiting examples. In an embodiment, the data storage device 101 may be coupled to the accessing device 161 indirectly, e.g., via a network. For example, the network may include a data center storage system network, an enterprise storage system network, a storage area network, a cloud storage network, a local area network (LAN), a wide area network (WAN), the Internet, and/or another network. In an embodiment, the data storage device 101 may be a network-attached storage (NAS) device or a component (e.g., an SSD device) of a data center storage system, an enterprise storage system, or a storage area network.

The accessing device 161 may include a processor and a memory (neither shown in FIG. 1). The memory may be configured to store data and/or instructions that may be executable by the processor. The memory may be a single memory or may include multiple memories, such as one or more non-volatile memories, one or more volatile memories, or a combination thereof. The accessing device 161 may issue one or more commands to the data storage device 101, such as one or more requests to erase data, read data from, or write data to the memory device 103 of the data storage device 101. The accessing device 161 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 101 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In an embodiment, the memory 104 may have a three-dimensional (3D) memory configuration. As an example, the memory 104 may have a 3D vertical bit line (VBL) configuration. In an embodiment, the memory 104 may be a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration, a monolithic 3-D memory, or a non-monolithic 3D memory configuration (e.g., a stacked die 3D memory configuration).

The memory 104 may include one or more blocks (e.g., shown in FIG. 1 as BL1, BL2, and BLn), such as one or more NAND flash erase blocks. To illustrate, the memory 104 may include at least one block of storage elements (e.g., also referred to herein as memory cells). Each storage element of the memory 104 may be programmable to a state (e.g., a threshold voltage in a flash configuration or a resistive state in a resistive memory configuration) that indicates one or more values. The memory 104 may include multiple planes 115,116. While only two planes are shown in FIG. 1, other numbers of planes may be implemented in other embodiments. Each plane 115,116 of the memory 104 may include one or more blocks, such as a first block 106, a second block 107, and a third block 108. Each block may consist of one or more wordlines (not shown). Although the memory 104 is illustrated as having two planes, with each plane having 3 blocks, in other embodiments, the memory 104 may include more than three blocks or fewer than three blocks. A memory may be configurable to operate as a single-level-cell (SLC) word line, as a multi-level-cell (MLC) word line, or as a ti-level-cell (TLC) wordline, as illustrative, non-limiting examples.

The memory device 104 may include support circuitry, such as read/write circuitry 105, to support operation of one or more memory dies of the data storage device 101. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 shown is coupled to the memory device 103 via the connection 120 (e.g., a bus), an interface, another structure, or a combination thereof. For example, the connection 120 may be a bus that includes one or more channels to enable the controller 130 to communicate with a single memory die of the memory device 103. As another example, the connection 120 may be a bus that includes multiple distinct channels to enable the controller 130 to communicate with each memory die of the memory device 103 in parallel with, and independently of, communication with other memory dies of the memory device 103. The controller 130 may be configured to receive data and instructions from the accessing device 161 and to send data to the accessing device 161. For example, the controller 130 may send data to the accessing device 161 via the interface 143 and connection 162, and the controller 130 may receive data from the accessing device 160 via the interface 143 and connection 162. The controller 130 may be configured to send data and commands to the memory 104 and to receive data from the memory 104. For example, the controller 130 may be configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 may be configured to send a read command to the memory 104 to access data from a specified address of the memory 104. The read command may specify the physical address of a portion of the memory 104 (e.g., a physical address of a word line of the memory 104).

The controller 130 shown includes an error correction code (ECC) engine module 150, a bit error counter module 140, and a number of data registers 151. The controller 130 may be configured to process data, such as data from data registers 151, to form one or more codewords to be stored at the memory 104. Storage elements that are indicated as not used for data storage may remain in an erased state (e.g., in a flash memory implementation where storage elements are erased before being programmed) or may store dummy data. For example, storing dummy data in unused storage elements may enhance an endurance of the memory 104 as compared to leaving the unused storage elements in an erased state.

The bit error counter module 140 may be configured to receive a bit error count for a wordline or a block (e.g., which is tracked in a table in block number module 141) from the ECC engine module 150. Block Number module 141 maintains a profile of the number of errors for wordlines/blocks, as the data in these wordlines/blocks is read. The bit error counter module 140 utilizes this error profile information (e.g., the bit error count) to classify the health of the wordline/block and create an appropriate tag (e.g., tags 109,111,113) and the variable size pre-defined data bits to be inserted in the wordline/block. The tag module 142 creates an identification tag, and the pre-defined data that is added to the data in the wordline/block before the data is programmed into the memory. When the data is read back at a later stage, the identification tag is used by the ECC block 150 to determine the number of valid data bits that needs to be checked for errors. The insertion of the variable size pre-defined data may change the code rate for the wordline/block.

Figure 2:
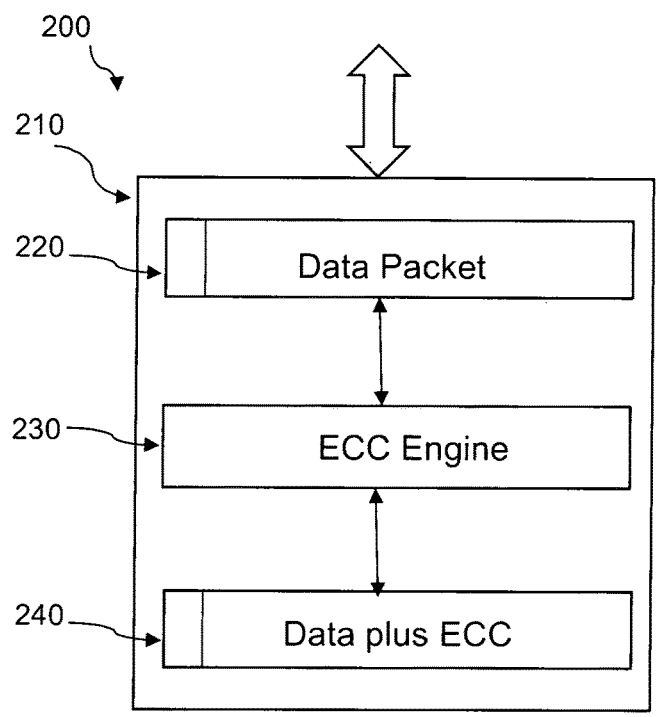
FIG. 2 illustrates a block diagram of an exemplary data flow when a controller reads or writes data to a memory device, according to an embodiment.

FIG. 2 illustrates a block diagram of an exemplary data flow when a controller reads or writes data to a memory device, according to an embodiment. In FIG. 2, a data flow 200 is shown for an ECC engine module 210, such as the ECC engine module 150 shown in FIG. 1. The ECC engine module 210 may receive a data packet 220 that includes data, ECC codes, and the tags 142 that indicate the health of the wordline/block. The ECC engine module 210 may include an ECC engine 230 configured to encode the multiple data words to form codewords, as represented by block 240 depicting data plus ECC. To illustrate, the ECC engine 230 may include an encoder configured to encode the multiple data words using an ECC encoding technique. The ECC engine 230 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 230 may also include a decoder that decodes the incoming data packet, identify errors that must be corrected, and generate the error count information needed to measure the health of the wordline, block or device.

Figure 3:
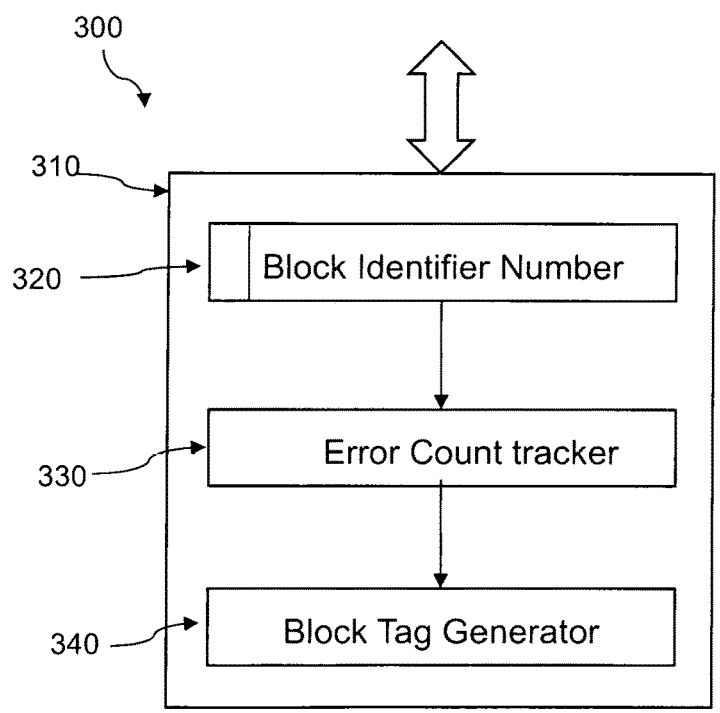
FIG. 3 illustrates a block diagram of an exemplary operation of an error count tracker for a word line, block of wordlines, or a cluster of blocks, according to an embodiment.

FIG. 3 illustrates a block diagram of an exemplary operation of an error count tracker for a wordline, block of wordlines, or a cluster of blocks, according to an embodiment. In FIG. 3, a data flow 300 is shown for a bit error counter module 310, such as the bit error counter module 140 shown in FIG. 1. Based on bit error information from an ECC engine module (e.g., the ECC engine modules 150 and 210 of FIGS. 1 and 2, respectively), the bit error counter module 310 may generate the tags (e.g., tags 142) that provide information on the health of the wordline/block and the pre-defined data to be appended to the wordline/block.

Figure 4:
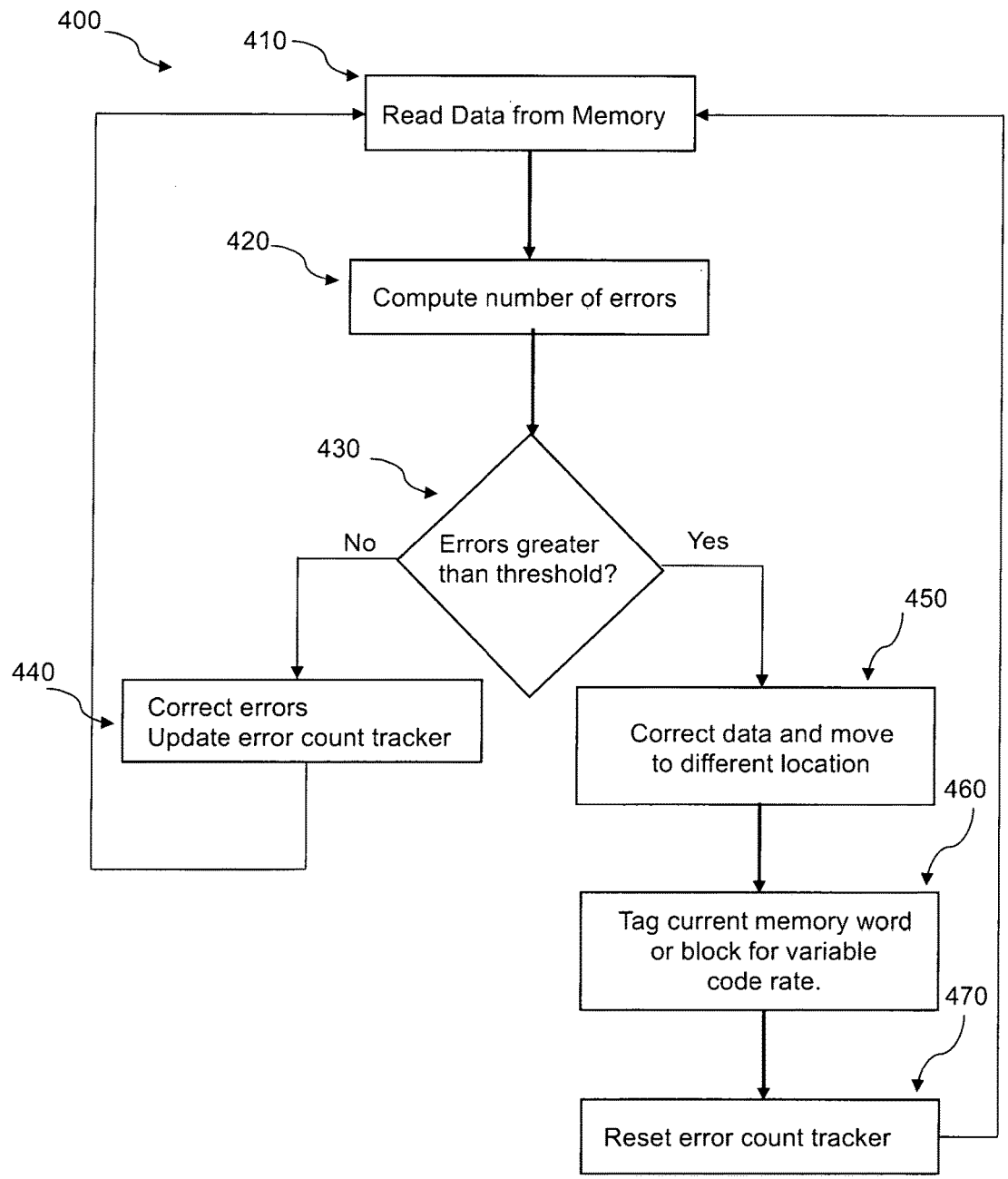
FIG. 4 illustrates a flow chart for an exemplary method in the operation of the storage system when tagging error prone wordlines, blocks of wordlines, cluster of blocks, or devices (ICs), according to an embodiment.

FIG. 4 illustrates a flow chart for an example method 400 in the operation of a storage system when tagging error prone wordlines, blocks of wordlines, cluster of blocks, or devices (ICs). The method 400 is depicted as a flow graph and is an illustrative non-limiting example. In an embodiment, the method 400 may be implemented in the controller 130 having the bit error counter module 140 and the ECC engine module 150. The description for the ECC engine module 210 of FIG. 2 and the bit error module 310 of FIG. 3 may also be applicable. The method 400 enables a tag (e.g., the tag 142 shown in FIG. 1) to be generated to represent various health levels of the wordline/block. The tag may contain information required to decode the contents read from the wordline/block.

At block 410, a data packet is read (or received) from the memory 104 of the memory device 103. The data packet may include, for example, one or more wordlines, blocks of wordlines, or clusters of wordlines. The data packet may be a fixed size. For instance, the data packet may be a 4K wordline, or a block of n number of 4K wordlines. The data packet may include raw data, as well as a portion of bits reserved for ECC, parity, special use and use of adaptive code rate. If the data packet has already been programmed via the method of FIG. 4, then the data packet may also include one or more tags and pre-defined data, as described for FIG. 4 below. For the sake of clarity and brevity, the programming of the data packet in the following description for FIG. 4 will be described for a wordline. It should be appreciated that the principles of the underlying techniques may be equally applicable to blocks of wordlines and clusters of blocks of wordlines.

At block 420, a bit error count indicating a number of errors for the wordline is computed (or determined). In an embodiment, the ECC engine module 150 of FIG. 1 may perform blocks 410 and 420.

At block 430, it is determined whether the bit error count (or the number of errors) exceeds a predetermined threshold that warrants modifying the memory using the adaptive code rate techniques described herein. For example, the trend in the bit error count may be checked and compared with one or more predetermined numbers (or values). These predetermined numbers may reflect various "health levels" (or states) of the memory (e.g., wordline).

For example, in an embodiment, one health level may refer to memory with no errors or a minimal number of errors that does not require modification of the memory using adaptive code rate techniques, which classify the memory as "healthy" or "good" for instance. Another health level may refer to memory with a significant number of errors to warrant modifying the memory using adaptive code rate techniques, which may classify the memory as "error prone" for instance. As an illustrative and non-limiting example, where 200 errors can be corrected in a wordline via ECC, a health level may be defined as "healthy" or "good" for bit error counts of less than 25 errors, and another health level defined as "error prone" for bit error counts of 25 errors or greater. In such case, the predetermined threshold number is 25. It should be appreciated that the values provided are exemplary, and that other values and health levels may be implemented in other embodiments.

In certain embodiments, the rate of increase of the number of errors may also be used to define health levels. For example, if the rate of increase in the number of errors between successive reads exceeds a predetermined threshold value, then the memory may be classified as "error prone" and warrant modification of the memory using adaptive code rate techniques. For example, a predetermined threshold for a rate of increase in the number of errors between successive reads may be 30. Therefore, if a wordline is read a first time with 10 errors and subsequently read a second time with 40 errors, the increase of 30 errors in subsequent readings may classify the wordline as "error prone", even if the predetermined threshold for the number of errors to classify the wordline as "error prone" is 50.

It should be appreciated that in certain embodiments, there may be more than two "health levels. For example, in an embodiment, an additional health level may be implemented and refer to a memory that is faulty and beyond repair, which may classify the memory as "corrupted" or "bad" and needing to be decommissioned for instance. As an illustrative and non-limiting example, where 200 errors can be corrected in a wordline via ECC, a health level may be defined as "healthy" or "good" for bit error counts of less than 25 errors, a second health level may be defined as "error prone" for bit error counts of 50 to 150 errors, and a third health level may be defined as "corrupted" for bit error counts greater than 150. It should be appreciated that the values provided are exemplary, and that other values and health levels may be implemented in other embodiments.

If the bit error count is determined to not exceed the predetermined threshold at block 430, then the current bit error count for the wordline (or block of wordlines) is updated and the errors corrected, as represented at block 440. For example, a bit error counter module (e.g., the bit error counter modules 140 and 310 of FIGS. 1 and 3, respectively) may track and update the bit error counts for successive reads of the wordline in a profile information table. As an illustrative and non-limiting example, if 50 errors is the predetermined threshold and the current bit error count results in 30 errors, then the 30 errors are corrected and the bit error count of the wordline is updated to 30 in the profile information table.

If at block 430 it is determined that the bit error count exceeds the predetermined threshold, then the errors are corrected and the raw data moved to a different location (e.g., a different wordline), as represented at block 450. Furthermore, at block 450, pre-defined data is generated (or created) and inserted into the wordline having the errors (also referred to here as error prone wordline for clarity purposes). The pre-defined data may be inserted into the error prone wordline at a location where errors occurred in the wordline. As a result, the error prone portion of the wordline (or block of wordlines) is replaced with the pre-defined data, resulting in the pre-defined data being concatenated to the remaining portion of the wordline allotted for raw data. As an illustrative and non-limiting example, where a 4 k wordline originally has 3.7 k allotted for raw data and thereafter 0.5 k of pre-defined data is inserted into the wordline, then the space allotted for raw data is reduced to 3.2 k. The pre-defined data may be implemented as any pre-defined pattern of bits, such as all 1's or all 0's for instance. In certain embodiments, the pre-defined data may be inserted into the data packet at more than one location where errors occur in the wordline.

While the amount of space allotted for raw data is reduced by the size of the pre-defined data, the code rate is improved by elimination of the error prone portion of the wordline. The pre-defined data improves the code rate of the data packet since errors that may occur in the pre-defined set of bits can be corrected and the ECC engine (e.g., the ECC engine module 150 in FIG. 1) has to effectively correct errors in a smaller number of data bits, thus effectively improving the correction capability of the ECC engine.

At block 460, a tag is generated and also inserted into the wordline. For instance, the tag may be concatenated to the beginning of the raw data portion of the wordline. The tag may provide various related information, such as information indicating a health of the wordline, a size of the pre-defined data inserted into the wordline, a pattern of bits in the pre-defined data inserted into the wordline, the location of the pre-defined data in the wordline, other information regarding the type of pre-defined data, codes (or instructions) for decoding the data, etc.

At block 470, the bit error count for the wordline is reset. For example, any fields for the bit error count of the wordline in a profile information table maintained by a bit error counter module (e.g., the bit error counter modules 140 and 330 in FIGS. 1 and 3, respectively) are reset. In this way, the bit error counter module may begin tracking the bit error count for the modified (or programmed) wordline having the inserted tag and pre-defined data. The modified wordline may be thereafter be used to store raw data in memory (e.g., the memory device 104). In some instances, the modified wordline may be used as available memory along with unmodified wordlines (or wordlines not having pre-defined data and tags inserted therein according to the techniques described herein). In another embodiment, the modified may be used as a secondary or back-up memory to unmodified memory. In an embodiment, the bit error counter modules 150 and 310 of FIGS. 1 and 3, respectively, may perform blocks 430 through 470 of FIG. 4.

Figure 5:
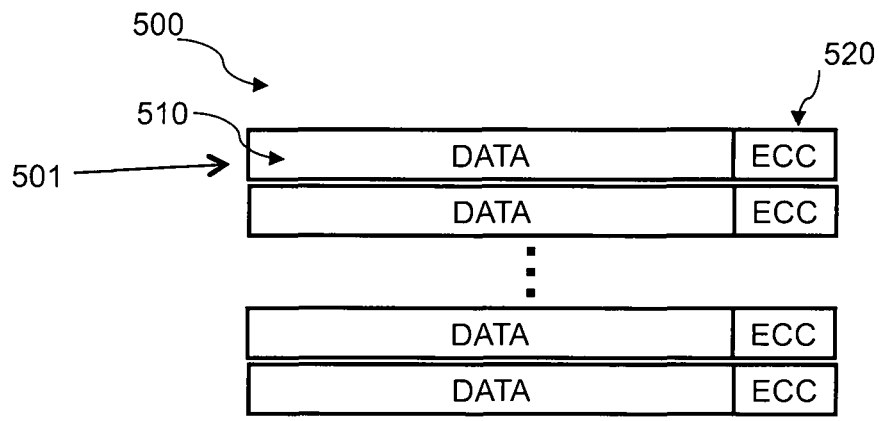
FIG. 5 illustrates a block diagram of an exemplary group of wordlines or blocks with normal programming contents, according to an embodiment.

FIG. 5 illustrates a group of wordlines/blocks with programmed contents, according to an embodiment. A group of wordlines/block 500 is shown including a wordline 501 having raw data portion 510 and error correction codes (ECC) portion 520. As an illustrative and non-limiting example, the size of raw data portion 510 may be 3.8 k, and the size of ECC portion 520 may be 0.2 k. In an embodiment, the ECC 520 may be generated by the ECC engine module 130 shown in FIG. 1. The raw data 510 may include header information relevant to the file system used.

Figure 6:
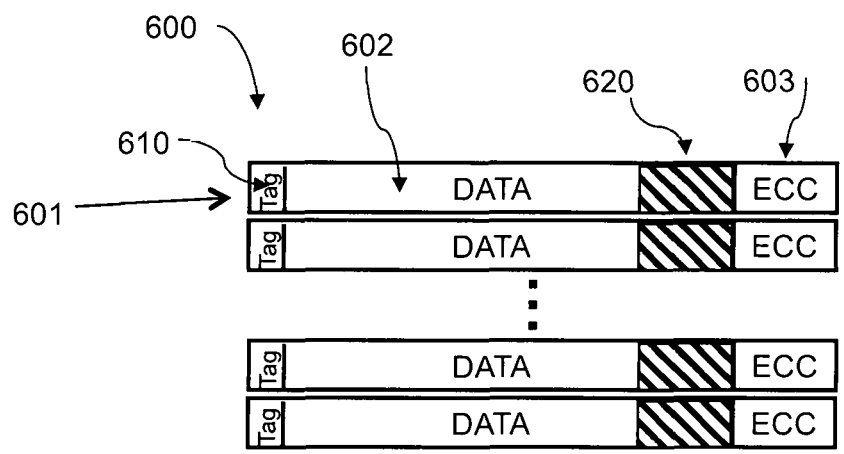
FIG. 6 illustrates a block diagram of an exemplary group of wordlines, blocks, or devices (ICs) where a number of bits (cells) are not programmed or programmed with a known (or pre-defined) pattern, according to an embodiment.

FIG. 6 illustrates a group of wordlines, blocks, or devices (ICs) where a number of bits (cells) are programmed with pre-defined data (e.g., a pre-defined pattern), according to an embodiment. In FIG. 6, a group of wordlines/blocks 600 is shown including a wordline 601 having raw data portion 602 and error correction codes (ECC) portion 603, as well as tag 610, and pre-defined data 620 that have been inserted into the wordline 601 according to techniques described herein. For example, using the wordline 501 shown in FIG. 5 as an example, the tag 610 and pre-defined data 620 are inserted into the raw data portion 510 (e.g., where errors were located) of wordline 501, thereby reducing the raw data portion 510 to the remaining raw data portion 602 shown in wordline 601 of FIG. 6. For instance, if the tag 610 and the pre-defined data 620 are 8 bits and 50 bits, respectively, then the raw data portion 602 of wordline 601 will be 58 bits smaller than the raw data portion 510 of wordline 501.

The tag 610 may indicate various related information, such as, but not limited to: a health of the wordline 601, the size of the pre-defined data 620, the pattern of bits in the pre-defined data 620, the location of the pre-defined data 620 in the wordline 601, codes (or instructions) for decoding the data packet, etc. In an embodiment, the tag 610 may include information for the size of the pre-defined data 620, location of the pre-defined data 620, and instructions for decoding the data packet. The size of the tag 610 may vary. In certain embodiments, the tag 610 may be several bytes in size. In another embodiment, the tag may be 8 bits in size. The size of the pre-defined data 620 may be variable and the size may be encoded in the tag 610. In certain embodiments, the pre-defined data 620 may be several bytes in size, such as 50 bits, 100 bits, 200 bits, etc. It should be appreciated that the sizes of the tags and the pre-defined data are exemplary, and that different sizes may be implemented in other embodiments.

When the techniques described in FIG. 4 are performed on a block of wordlines, a bit error count may be performed for the entire block of wordlines, and pre-defined data may be inserted into the block of wordlines at one or more locations in the block of wordlines, such as where errors are located. The pre-defined data may vary in size at different locations. The pre-defined data may be inserted into one or more wordlines of the block of wordlines. In an embodiment, a single tag may be implemented for the block as a whole, such as one tag inserted at the beginning of the block of wordlines and which identifies the sizes and locations where the pre-defined data have been inserted in the block of wordlines. The tag may also include other information as described earlier, such as decoding instructions for instance. In another embodiment, a tag may be included in each wordline of the block of wordlines, or in only the wordlines having pre-defined data inserted therein. In such case, for example, a tag may be inserted at the beginning of a particular wordline and identify the sizes and locations of any pre-defined data that have been inserted within that particular wordline.

The tags may identify sizes and locations of pre-defined data in various manners. For example, a tag may indicate a size of pre-defined data, as well as a starting bit location in the wordline, an ending bit location in the wordline, or both. For instance, as an illustrative and non-limiting example, a tag may indicate that a pre-defined data is 50 bits in size and has a starting bit location at 500 bits into the wordline. In an embodiment, a tag may indicate a location of pre-defined data by being "right justified" or "left justified, with each having a specific starting or ending bit location. For example, right justified may refer to pre-defined data located at the end of the raw data portion with an ending bit located immediately before the ECC, such as shown in FIG. 6. Left justified may refer to a pre-defined data located at the beginning of the raw data portion having a starting bit located immediately after the tag.

Figure 7:
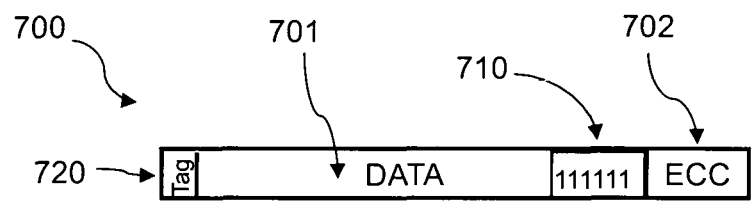
FIG. 7 illustrates a block diagram of an exemplary wordline, or block with s variable number of cells (bits) with known data pattern, according to an embodiment.

FIG. 7 illustrates a block diagram of an exemplary wordline (or block of wordlines) with s variable number of cells (bits) with pre-defined data pattern, according to an embodiment. In FIG. 7, a wordline/block 700 is shown including a tag 720 and pre-defined data pattern 710 that have been inserted within the wordline/block 700. The wordline/block 700 also includes raw data portion 701 and ECC portion 702. In the illustrative, non-limiting example shown in FIG. 7, the pre-defined data 710 is shown as a pattern of all 1's. Addition of a known, or pre-defined, pattern will improve the code rate and enable prolonged use of marginal wordlines, blocks or memory devices. The tag 720 may provide information on how many of the cells/bits are programmed with known data patterns. This enables the capability to adapt the size of the cells/bits (with known program) based on the severity of wordline/block error rate over the life of the system.

EXAMPLE EMBODIMENTS

In certain aspects of the present disclosure, a data storage device is provided that includes a memory device and a controller. The memory includes one or more memory dies. The controller is communicatively coupled to the memory device and includes logic to receive a first data packet from the memory device; determine a bit error count for the first data packet; determine whether the bit error count exceeds a predetermined threshold; and when the bit error count is determined to exceed the predetermined threshold: correct errors identified in the bit error count; generate pre-defined data and insert the pre-defined data into the first data packet at a location where errors occurred in the first data packet; and generate a tag and insert the tag into the first data packet. The tag includes information indicating a size and a location of the pre-defined data in the first data packet.

In an embodiment, the first data packet is a wordline, block of wordlines, or a cluster of blocks of wordlines; and, the pre-defined data and tag are inserted into the wordline, block of wordlines, or a cluster of blocks of wordlines.

In an embodiment, the controller further includes logic to move raw data including the corrected errors from the first data packet to a second data packet, when the error count is determined to exceed the predetermined threshold.

In an embodiment, the controller further includes logic to track bit error counts for the first data packet, and reset the bit error count for the first data packet after the pre-defined data and the tag are inserted into the first data packet.

In an embodiment, the tag further includes decoding instructions.

In an embodiment, the pre-defined data is a pattern of all 1's or 0's.

In an embodiment, the controller further includes logic to correct errors identified in the bit error count and update the bit error count for the first data packet, when the bit error count is determined to not exceed the predetermined threshold.

In an embodiment, the predetermined threshold is a rate of increase of bit error counts. The bit error count is determined to exceed the predetermined threshold based on a comparison to a previous bit error count for the first data packet.

In an embodiment, the memory device includes a three-dimensional (3D) memory configuration.

In an embodiment, the controller further includes logic to classify one or more health levels for data packets, maintain profile information for the data packets, and determine the predetermined threshold for the first data packet based on the health level classifications. The profile information includes bit error counts for the data packets. The data packets include the first data packet.

In certain aspects of the present disclosure, a system is provided that includes a data storage device and an accessing device communicatively coupled to the data storage device. The accessing device is configured to issue commands to the data storage device to read data from or write data to the memory device. The data storage device includes a memory device, and a controller communicatively coupled to the memory device. The controller includes logic to receive a first data packet from the memory device; determine a bit error count for the first data packet; determine whether the bit error count exceeds a predetermined threshold; and when the bit error count is determined to exceed the predetermined threshold: correct errors identified in the bit error count; generate pre-defined data and insert the pre-defined data into the first data packet at a location where errors occurred in the first data packet; and generate a tag and insert the tag into the first data packet. The tag includes information indicating a size and a location of the pre-defined data in the first data packet.

In an embodiment, the first data packet is a wordline, block of wordlines, or a cluster of blocks of wordlines. The pre-defined data and tag are inserted into the wordline, block of wordlines, or a cluster of blocks of wordlines.

In an embodiment, the controller further includes logic to track bit error counts for the first data packet; move raw data including the corrected errors from the first data packet to a second data packet, when the error count is determined to exceed the predetermined threshold; and reset the bit error count for the first data packet.

In an embodiment, the data storage device is embedded within the accessing device.

In certain aspects of the present disclosure, a method is provided that includes receiving, at a controller, a first data packet from a memory device that is communicatively coupled to the controller; determining, by the controller, a bit error count for the first data packet; determining, by the controller, that the bit error count exceeds a predetermined threshold; and when the bit error count is determined to exceed the predetermined threshold: correcting, by the controller, errors identified in the bit error count; generating, by the controller, pre-defined data and inserting, by the controller, the pre-defined data into the first data packet at a location where errors occurred in the first data packet; and generating, by the controller, a tag and inserting, by the controller, the tag into the first data packet. The tag includes information indicating a size and a location of the pre-defined data in the first data packet.

In an embodiment, the first data packet is a wordline, block of wordlines, or a cluster of blocks of wordlines. The pre-defined data and tag are inserted into the wordline, block of wordlines, or a cluster of blocks of wordlines.

In an embodiment, raw data including the corrected errors from the first data packet to a second data packet is moved by the controller, when the error count is determined to exceed the predetermined threshold.

In an embodiment, bit error counts are tracked by the controller for the first data packet; and the bit error count for the first data packet are reset by the controller after the pre-defined data and the tag are inserted into the first data packet.

In an embodiment, the tag further includes decoding instructions.

In an embodiment, the pre-defined data is a pattern of all 1's or 0's.

Throughout the foregoing description, and for the purposes of explanation, numerous specific details are set forth in order to provide a thorough understanding of the described techniques. It will be apparent, however, to one skilled in the art that these techniques can be practiced without some of these specific details. Although various embodiments that incorporate these teachings have been shown and described in detail, those skilled in the art could readily devise many other varied embodiments or mechanisms to incorporate these techniques. Also, embodiments can include various operations as set forth above, fewer operations, or more operations; or operations in an order. Accordingly, the scope and spirit of the invention should only be judged in terms of any accompanying claims that may be appended, as well as any legal equivalents thereof.

Reference throughout the specification to "one embodiment" or "an embodiment" is used to mean that a particular feature, structure or characteristic described in connection with an embodiment is included in at least one embodiment. Thus, the appearance of the expressions "in one embodiment" or "in an embodiment" in various places throughout the specification are not necessarily referring to the same embodiment. Further, the particular features, structures or characteristics may be combined in any suitable manner in one or several embodiments. Although the present invention has been described above with reference to specific embodiments, it is not intended to be limited to the specific form set forth herein. Rather, embodiments other than those specific described above are equally possible within the scope of any accompanying claims. Moreover, it should be appreciated that the terms "comprise/comprises" or "include/includes", as used herein, do not exclude the presence of other elements or steps. Furthermore, although individual features may be included in different claims, these may possibly advantageously be combined, and the inclusion of different claims does not imply that a combination of features is not feasible and/or advantageous. In addition, singular references do not exclude a plurality. Finally, reference signs in the claims are provided merely as a clarifying example and should not be construed as limiting the scope of the claims in any way.

Various components and modules described herein may include software, hardware, or a combination of software and hardware. The components and modules may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein. It should also be appreciated that one or more modules may be combined to perform the functionalities of each module, or that the functionalities of one module may be broken up into two modules, without compromising the underlying principles of the techniques described in the present disclosure.

A computer or machine readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

What is claimed is:

1. A data storage device, comprising:
    a memory device comprising one or more memory dies; and
    a controller communicatively coupled to the memory device, the controller comprising hardware logic and configured to:
        receive a first data packet from the memory device, the first data packet comprising data from a first one or more wordlines in the memory device;
        compute a bit error count for errors identified in the first data packet;
        determine whether the bit error count exceeds a predetermined threshold; and
        when the bit error count is determined to exceed the predetermined threshold:
            correct the errors identified in the first data packet;
            insert pre-defined data into the first one or more wordlines at a location where the errors occurred in the first data packet; and
            generate a tag and insert the tag into the first one or more wordlines, the tag comprising information indicating a size and the location of the pre-defined data in the first one or more wordlines.

2. The data storage device of claim 1, wherein the first data packet comprises data from a wordline, block of wordlines, or a cluster of blocks of wordlines; and wherein the pre-defined data and the tag are inserted into the wordline, block of wordlines, or a cluster of blocks of wordlines, respectively.

3. The data storage device of claim 1, wherein the controller is further configured to, when the error count is determined to exceed the predetermined threshold, store raw data from the first data packet to a second one or more wordlines, wherein the second one or more wordlines is at a different location in the memory device than the first one or more wordlines, and wherein the raw data comprises the corrected errors.

4. The data storage device of claim 1, wherein the controller is further configured to:
    track bit error counts for the first one or more wordlines; and reset the bit error count for the first one or more wordlines after the pre-defined data and the tag are inserted into the first one or more wordlines.

5. The data storage device of claim 1, wherein the tag further comprises decoding instructions.

6. The data storage device of claim 1, wherein the pre-defined data is a pattern of all 1's or 0's.

7. The data storage device of claim 1, wherein the controller is further configured to, when the bit error count is determined to not exceed the predetermined threshold:
correct the errors identified in the first data packet; and
update the bit error count for the first one or more wordlines.

8. The data storage device of claim 1, wherein the predetermined threshold is a rate of increase of bit error counts, and wherein the bit error count is determined to exceed the predetermined threshold based on a comparison to a previous bit error count for the first one or more wordlines.

9. The data storage device of claim 1, wherein the memory device comprises a three-dimensional (3D) memory configuration.

10. The data storage device of claim 1, wherein the controller is further configured to:
classify one or more health levels for the first one or more wordlines;
maintain profile information for the the first one or more wordlines, the profile information comprising bit error counts for the the first one or more wordlines; and
determine the predetermined threshold for the first data packet based on the health level classifications for the first one or more wordlines.

11. A system, comprising:
a data storage device comprising:
a memory device comprising one or more memory dies; and
a controller communicatively coupled to the memory device, the controller comprises hardware logic and configured to:
receive a first data packet from the memory device, the first data packet comprising data from a first one or more wordlines in the memory device;
compute a bit error count for errors identified in the first data packet;
determine whether the bit error count exceeds a predetermined threshold; and
when the bit error count is determined to exceed the predetermined threshold:
correct the errors identified in the first data packet;
insert pre-defined data into the first one or more wordlines at a location where the errors occurred; and
generate a tag and insert the tag into the first one or more wordlines, the tag comprising information indicating a size and the location of the pre-defined data in the first one or more wordlines; and
an accessing device communicatively coupled to the data storage device, wherein the accessing device is configured to issue commands to the data storage device to perform read and write operations on the memory device.

12. The system of claim 11, wherein the first data packet comprises data from a wordline, block of wordlines, or a cluster of blocks of wordlines; and wherein the pre-defined data and the tag are inserted into the wordline, block of wordlines, or a cluster of blocks of wordlines, respectively.

13. The system of claim 11, wherein the controller is further configured to:
track bit error counts for the first one or more wordlines;
when the error count is determined to exceed the predetermined threshold, store raw data from the first data packet to a second one or more wordlines, wherein the second one or more wordlines is at a different location in the memory device than the first one or more wordlines, and wherein the raw data comprises the corrected errors; and
reset the bit error count for the first one or more wordlines.

14. The system of claim 11, wherein the data storage device is embedded within the accessing device.

15. A method, comprising:
receiving, by a controller comprising hardware logic, a first data packet from a memory device, the first data packet comprising data from a first one or more wordlines in the memory device, and the memory device communicatively coupled to the controller;
computing, by the controller, a bit error count for errors identified in the first data packet;
determining, by the controller, whether the bit error count exceeds a predetermined threshold; and
when the bit error count is determined to exceed the predetermined threshold:
correcting, by the controller, the errors identified in the first data packet;
inserting, by the controller, pre-defined data into the first one or more wordlines at a location where the errors occurred; and
generating, by the controller, a tag and inserting, by the controller, the tag into the first one or more wordlines, wherein the tag comprises information indicating a size and the location of the pre-defined data in the first one or more wordlines.

16. The method of claim 15, wherein the first data packet comprises data from a wordline, block of wordlines, or a cluster of blocks of wordlines; and wherein the pre-defined data and the tag are inserted into the wordline, block of wordlines, or a cluster of blocks of wordlines, respectively.

17. The method of claim 15, further comprising, when the error count is determined to exceed the predetermined threshold, storing, by the controller, raw data from the first data packet to a second one or more wordlines, wherein the second one or more wordlines is at a different location in the memory device than the first one or more wordlines, and wherein the raw data comprises the corrected errors.

18. The method of claim 15, further comprising:
tracking, by the controller, bit error counts for the first one or more wordlines; and
resetting, by the controller, the bit error count for the first one or more wordlines after the pre-defined data and the tag are inserted into the first one or more wordlines.

19. The method of claim 15, wherein the tag further comprises decoding instructions.

20. The method of claim 15, wherein the pre-defined data is a pattern of all 1's or 0's.

* * * * *